(12) United States Patent
Zhang et al.

(10) Patent No.: US 9,897,658 B2
(45) Date of Patent: Feb. 20, 2018

(54) SYSTEM AND METHOD FOR DETECTING BATTERY END OF DISCHARGE

(71) Applicant: General Electric Company, Schenectady, NY (US)

(72) Inventors: Jiucai Zhang, Arvada, CO (US); Charles Clarence Hicks, Jr., Loundonville, NY (US); Sam T. Liu, Niskayuna, NY (US); Robert A. Kaucic, Niskayuna, NY (US); Leng Mao, Latham, NY (US); David E. James, Clifton Park, NY (US); Herman Lucas Norbert Wiegman, Niskayuna, NY (US); Mert Geveci, Delmar, NY (US)

(73) Assignee: General Electric Company, Schenectady, NY (US)

( * ) Notice: Subject to any disclaimer, the term of this patent is extended or adjusted under 35 U.S.C. 154(b) by 477 days.

(21) Appl. No.: 14/606,068

(22) Filed: Jan. 27, 2015

(65) Prior Publication Data

US 2016/0218400 A1 Jul. 28, 2016

(51) Int. Cl.
*H02J 7/00* (2006.01)
*G01R 31/36* (2006.01)
*H01M 10/48* (2006.01)

(52) U.S. Cl.
CPC ....... *G01R 31/362* (2013.01); *G01R 31/3651* (2013.01); *H01M 10/48* (2013.01)

(58) Field of Classification Search
CPC ..................................................... Y02E 60/12
USPC .......................................................... 320/131
See application file for complete search history.

(56) References Cited

U.S. PATENT DOCUMENTS

| | | | |
|---|---|---|---|
| 5,596,260 A | 1/1997 | Moravec et al. | |
| 6,252,377 B1 * | 6/2001 | Shibutani | G01R 31/3624 320/132 |
| 6,356,083 B1 | 3/2002 | Ying | |
| 6,424,157 B1 | 7/2002 | Gollomp et al. | |
| 6,453,249 B1 * | 9/2002 | Shibutani | G01R 31/3679 320/132 |
| 6,646,419 B1 | 11/2003 | Ying | |
| 7,710,072 B2 * | 5/2010 | Ibrahim | H02J 7/0063 320/127 |
| 7,834,582 B2 | 11/2010 | Luan et al. | |
| 8,374,807 B2 | 2/2013 | Hall | |
| 8,614,563 B2 | 12/2013 | Baughman | |

(Continued)

*Primary Examiner* — Yalkew Fantu
(74) *Attorney, Agent, or Firm* — Dority & Manning, P.A.

(57) ABSTRACT

The present disclosure is directed to a system and method for controlling an energy storage device by more accurately detecting an end-of-discharge voltage of the energy storage device. More specifically, in one embodiment, the method includes determining an end-of-discharge voltage threshold for the energy storage device. Another step includes filtering the end-of-discharge voltage threshold via a filter. The method also includes adjusting a time constant of the filter based on at least one voltage-current condition. Still a further step includes comparing the filtered end-of-discharge voltage threshold and a terminal voltage of the energy storage device. Based on the comparison, the method includes determining a change of state of the energy storage device. Thus, the energy storage device can be controlled based on the change of state.

20 Claims, 7 Drawing Sheets

(56) References Cited

U.S. PATENT DOCUMENTS

| | | | |
|---|---|---|---|
| 9,455,580 B2* | 9/2016 | Mao | H02J 7/0016 |
| 2001/0028238 A1* | 10/2001 | Nakamura | G01R 31/3662 |
| | | | 320/132 |
| 2011/0226559 A1 | 9/2011 | Chen et al. | |
| 2013/0057219 A1* | 3/2013 | Sakata | B60L 11/1866 |
| | | | 320/118 |
| 2013/0257380 A1* | 10/2013 | Kato | H02J 7/0075 |
| | | | 320/131 |

* cited by examiner

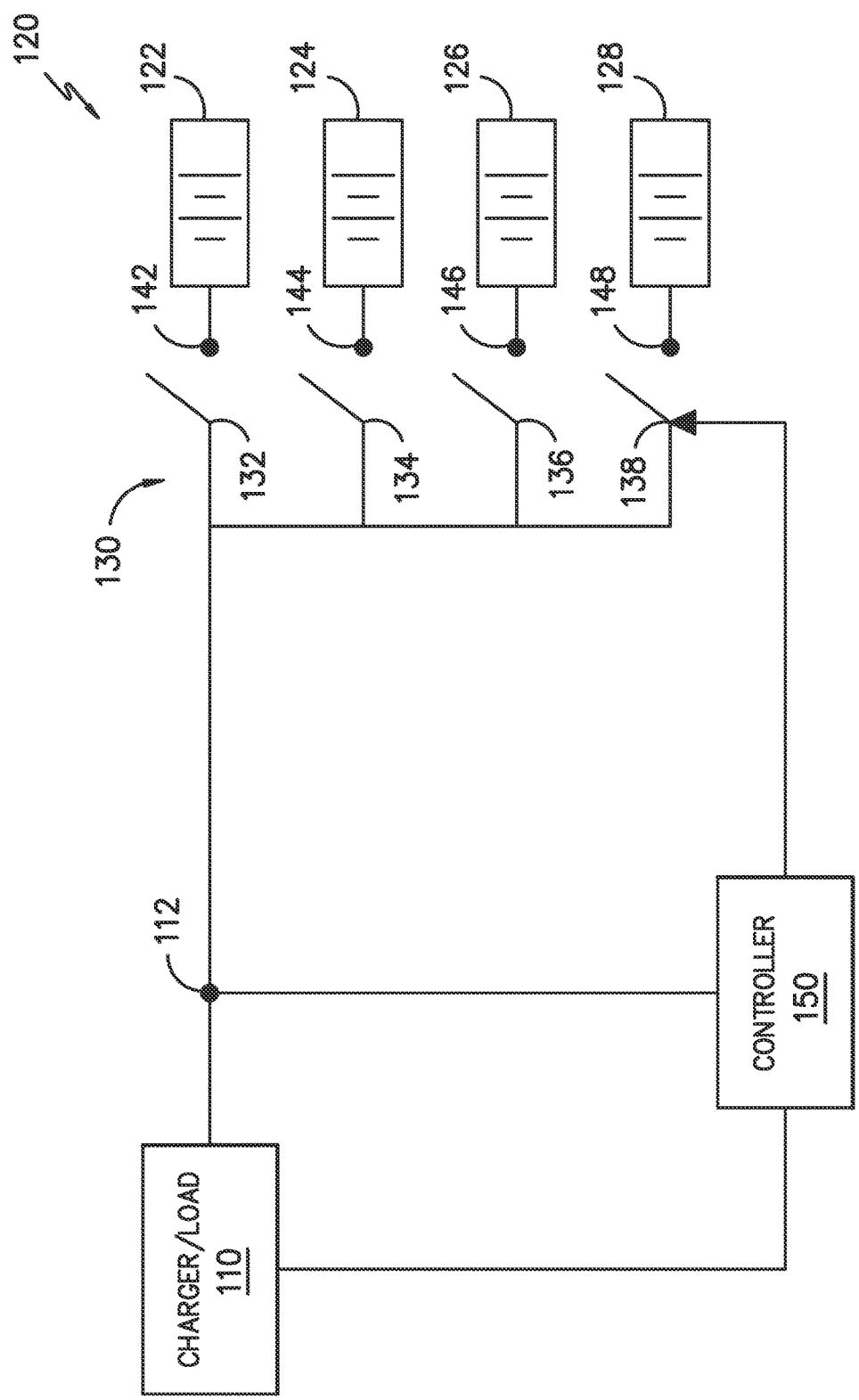

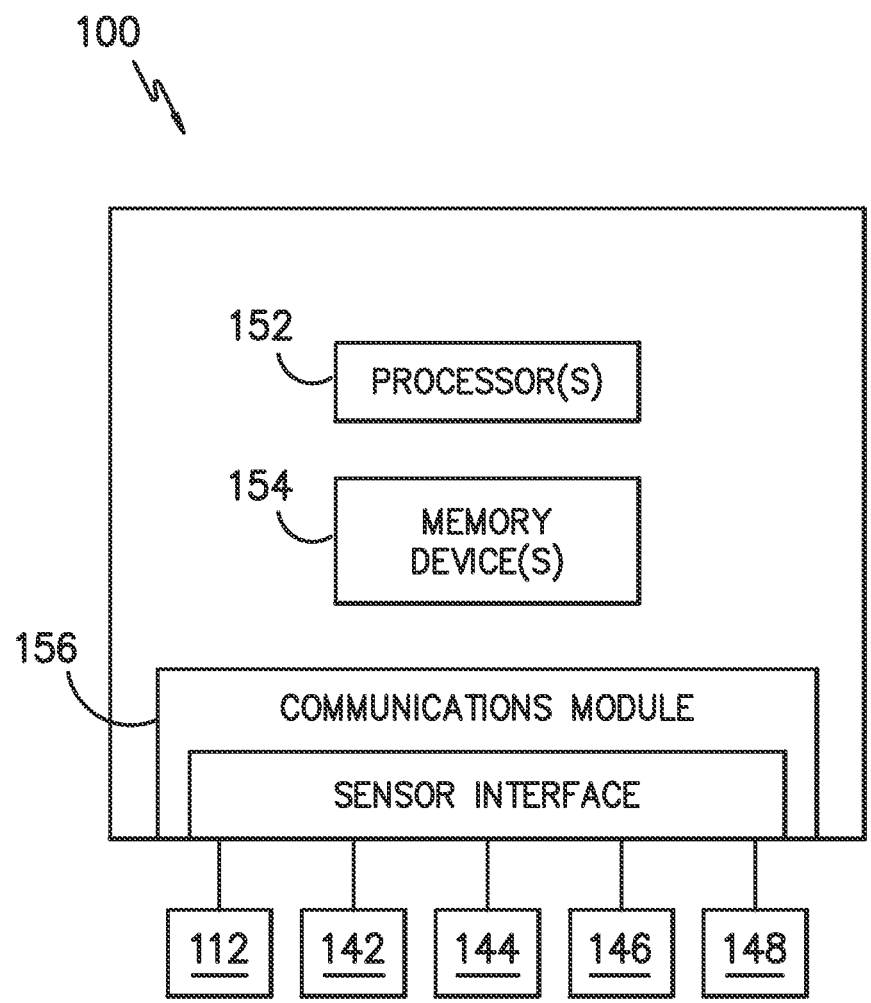
FIG. -2-

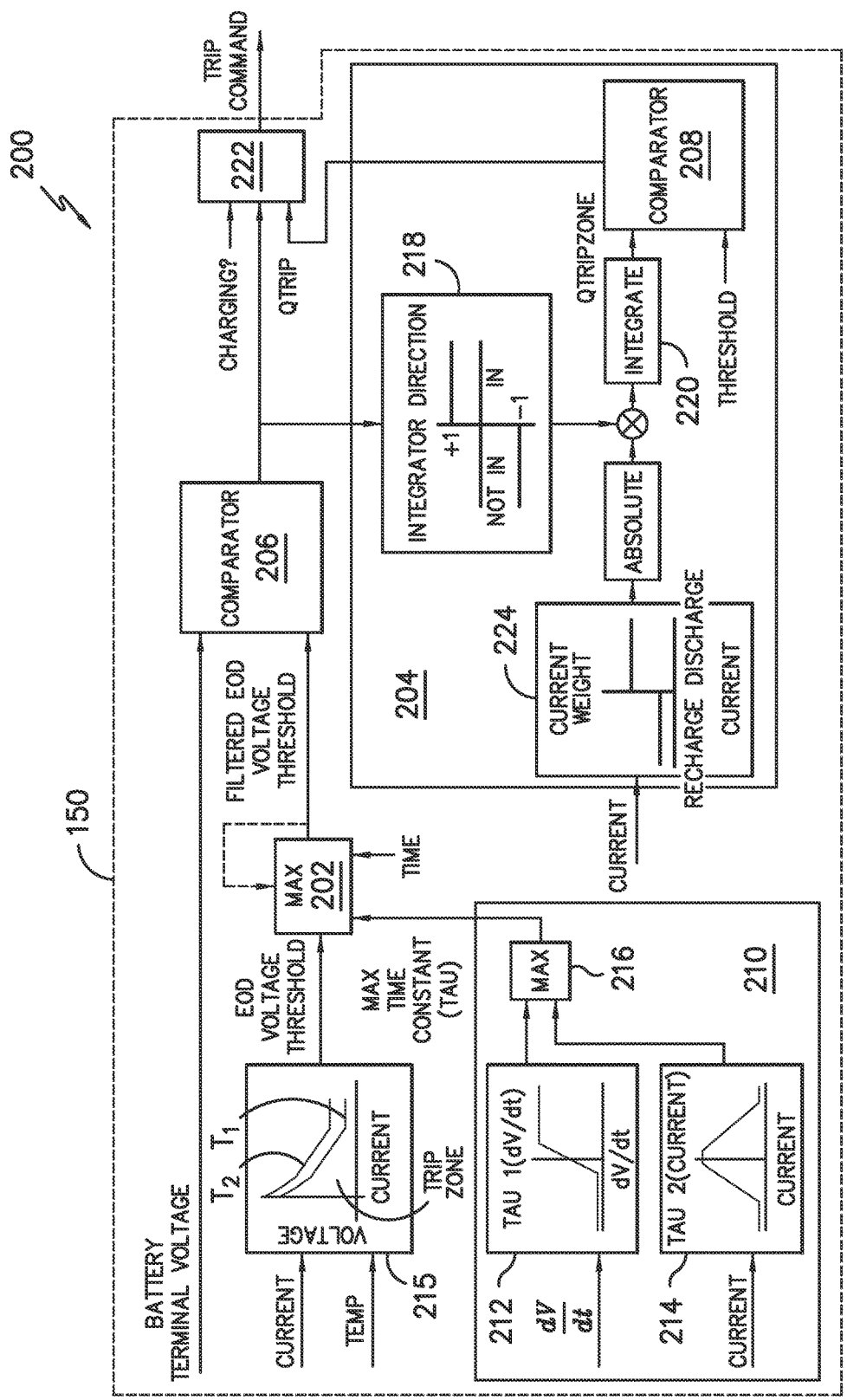
FIG. -3-

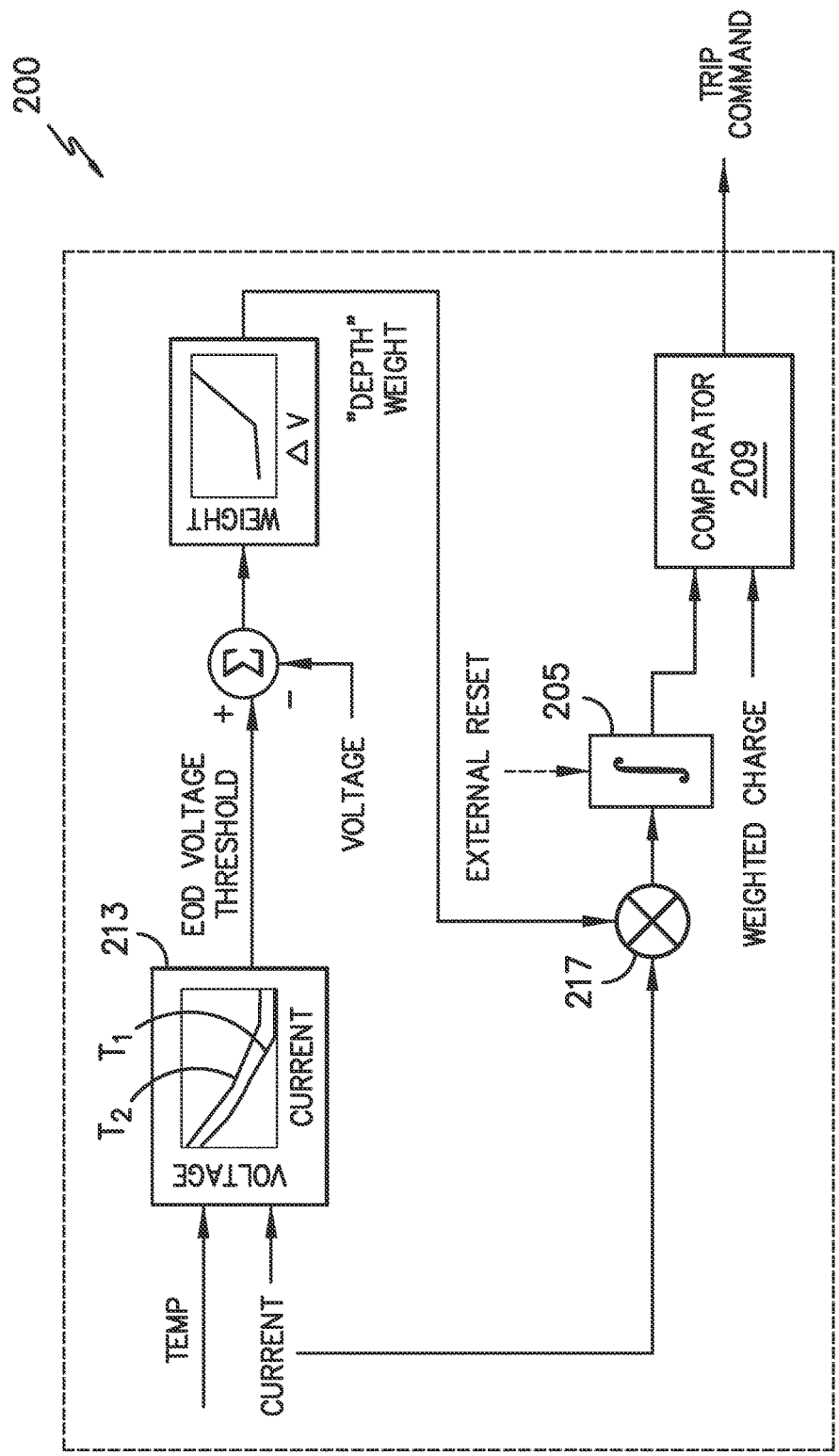

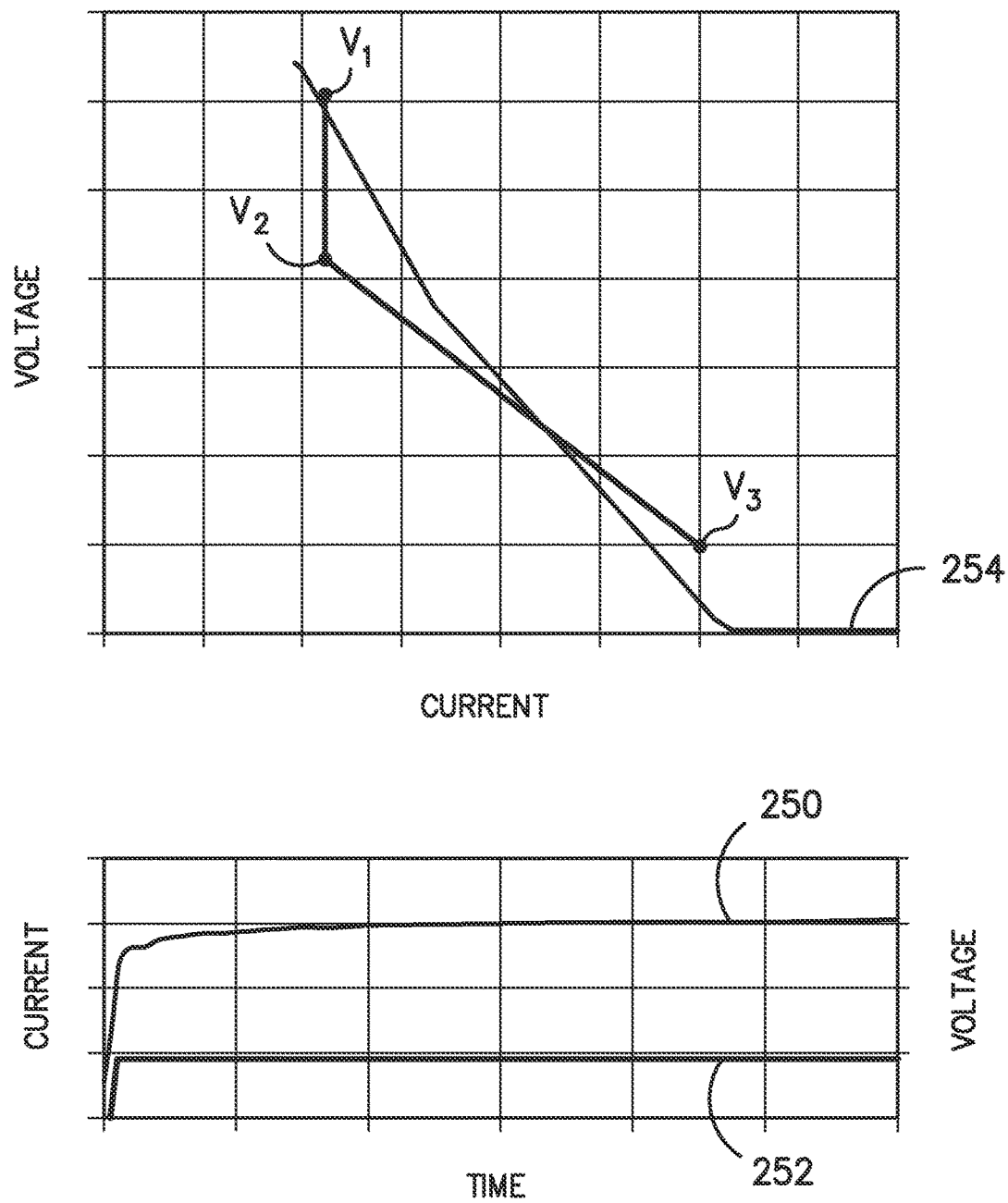
FIG. -5-

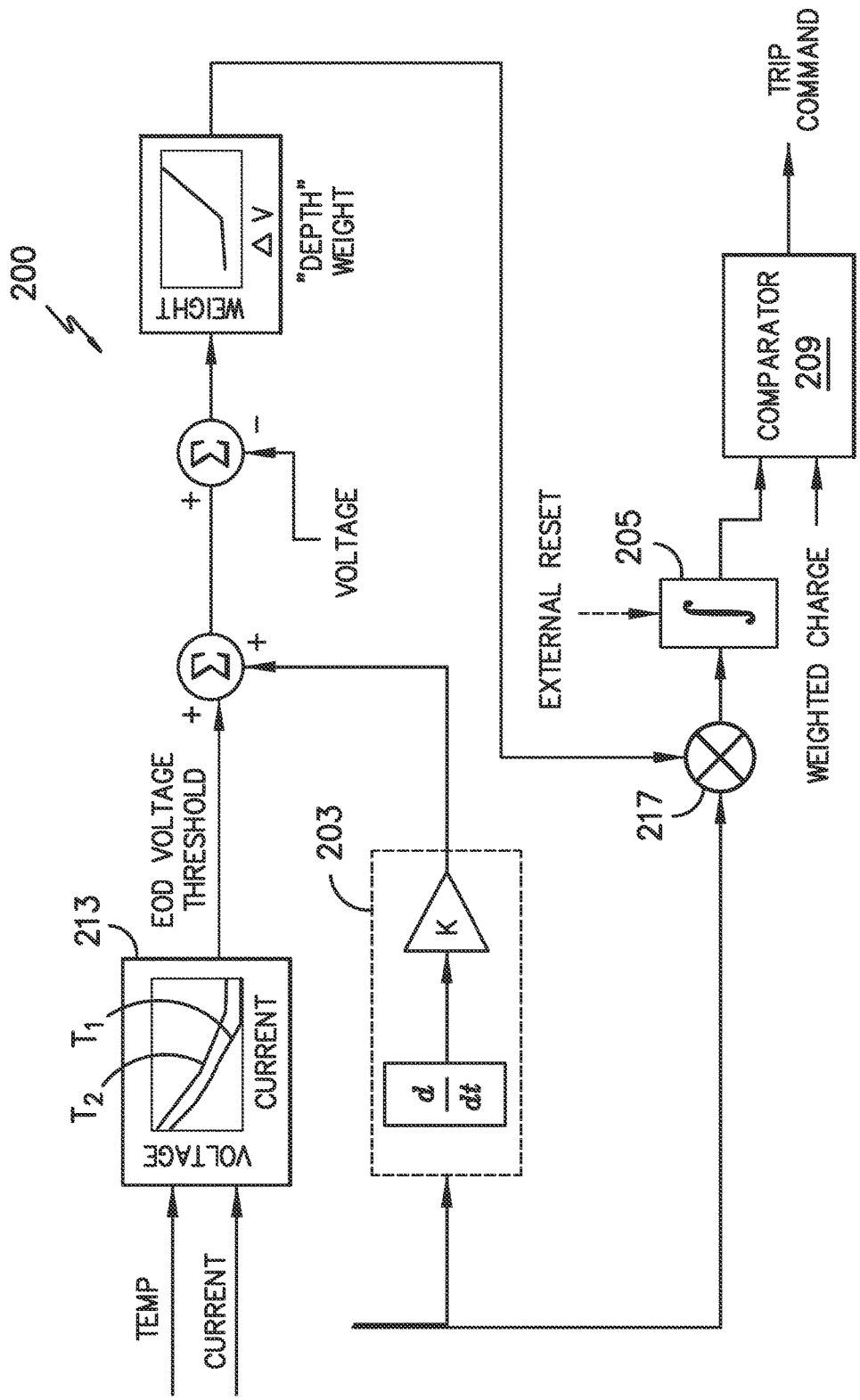
FIG. -6-

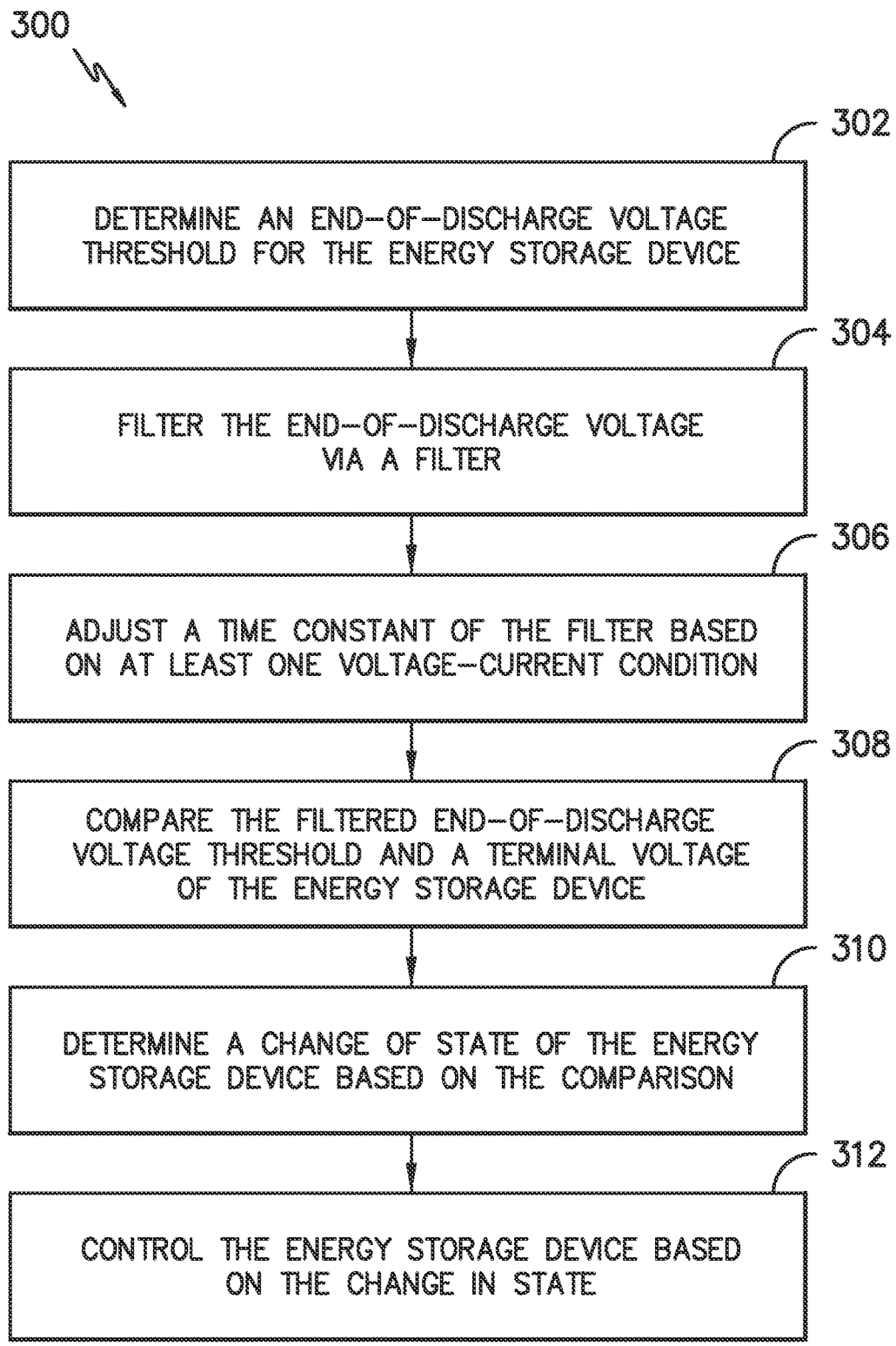
FIG. -7-

SYSTEM AND METHOD FOR DETECTING BATTERY END OF DISCHARGE

FIELD OF THE INVENTION

The present subject matter relates generally to batteries and, more particularly, to systems and methods for detecting battery end-of-discharge.

BACKGROUND OF THE INVENTION

Battery packs containing one or more batteries or cells are used in many applications, e.g. telecommunications, grid, mobile, and/or any other suitable applications. As a battery pack is used and the batteries therein age, the batteries may need to be balanced and/or monitored with respect to their states of charge, e.g. their end-of-discharge voltage. The state of charge (SOC) of a battery, as used herein, is generally defined as the percentage of the full capacity of a battery that is still available for further discharge. Similarly, the end-of-discharge (EOD) voltage of a battery generally refers to a voltage level corresponding to the critical level of charge within the battery. Any further discharge beyond this critical level may cause a high risk of damage to the cells of the battery. Moreover, both due to aging effects and inaccuracies associated with direct monitoring of SOC, it is desirable to end the discharge of the battery based on the voltage level. Thus, to protect the battery from over-discharging, most devices prevent operation beyond a specified end-of-discharge voltage.

Conventional methods for detecting end-of-discharge of a battery utilize unreliable and indirect measurements such as charge, SOC, and/or resistance. Still further conventional methods utilize voltage and/or power thresholds; however, such methods are not typically accurate or reliable due to voltage polarization. More specifically, voltages of the batteries tend to have at least some transient behaviors under dynamic loads, which can make detection of end-of-discharge very challenging. Thus, the dynamic variations in voltage may result in either an over-discharge condition or an early termination of the discharge. An additional problem that exists with conventional methods is that during normal cell aging, the resistance profile of the cells tends to increase.

In view of the aforementioned issues, it is desirable to provide an improved system and method for detecting battery end-of-discharge that is accurate and persistent, especially when the battery is excited by a dynamic load. In addition, a system and method for detecting battery end-of-discharge that is insensitive to aging would be advantageous.

BRIEF DESCRIPTION OF THE INVENTION

Aspects and advantages of the invention will be set forth in part in the following description, or may be obvious from the description, or may be learned through practice of the invention.

In accordance with one embodiment of the present disclosure, a method for controlling an energy storage device, e.g. such as a battery, is disclosed. In one embodiment, for example, the method includes determining an end-of-discharge voltage threshold for the energy storage device. Another step includes filtering the end-of-discharge voltage threshold via a filter. The method also includes adjusting a time constant of the filter based on at least one voltage-current condition. Still a further step includes comparing the filtered end-of-discharge voltage threshold and a terminal voltage of the energy storage device. Based on the comparison, the method also includes determining a change of state of the energy storage device. As used herein, the change of state of the energy storage device is where the instantaneous charge stored in the battery is under a level that is favorable for long-term operation of the battery. Thus, the energy storage device can be controlled based on the change of state.

In another embodiment, the voltage-current condition may include, at least, a current and a voltage trend of the energy storage device. As such, in a particular embodiment, the step of adjusting the time constant of the filter based on the voltage-current condition may further include determining a current time constant based on the current from a one-dimensional look-up table and determining a voltage time constant based on the voltage trend from another one-dimensional look-up table. Thus, in a further embodiment, the method may include determining a maximum time constant between the current time constant and the voltage time constant. In additional embodiments, the method further includes adjusting the time constant of the filter based on the maximum time constant. In particular embodiments, the filter may be a low-pass filter.

In still another embodiment, the step of determining the end-of-discharge voltage threshold for the energy storage device may also include inputting the current and temperature of the energy storage device into a two-dimensional look-up table to determine the end-of-discharge voltage threshold.

In further embodiments, the step of comparing the filtered end-of-discharge voltage threshold and the terminal voltage of the energy storage device may also include determining whether the terminal voltage is above or below the end-of-discharge voltage. More specifically, if the terminal voltage is above the end-of-discharge voltage threshold, then the energy storage device is not operating within a trip zone and if the terminal voltage is below the end-of-discharge voltage threshold, then the energy storage device is operating within a trip zone.

In additional embodiments, the step of determining the change of state of the energy storage device may also include integrating the current from zero to an upper bound of ampere-hours if the terminal voltage is within the trip zone and integrating the current down from an instantaneous value to zero ampere-hours if the terminal voltage is not within the trip zone.

In yet another embodiment, the step of controlling the energy storage device based on the change of state may further include tripping the energy storage device when the integrated current reaches a predetermined threshold. In further embodiments, the method may also include controlling a speed of the integration by a current weight.

In particular embodiments, the energy storage device may be a lithium ion battery, a sodium nickel chloride battery, a sodium sulfur battery, a nickel metal hydride battery, a nickel cadmium battery, a fuel cell, or any other suitable device.

In another aspect, the present disclosure is directed to a method for controlling an energy storage device. The method includes determining an end-of-discharge voltage threshold for the energy storage device based on, at least in part, a temperature and a current of the energy storage device. Another step includes multiplying the current by a current weight, the current weight a function of a distance to the end-of-discharge voltage threshold. The method also includes determining an end-of-discharge voltage by integrating the weighted current and comparing the end-of-discharge voltage with a terminal voltage of the energy storage device. Still another step includes controlling the energy storage device based on the comparison.

In yet another aspect, the present disclosure is directed to a system for controlling an energy storage device. The system includes a controller having at least a filter, an integrator, and a comparator. The controller is configured to perform one or more operations, including but not limited to determining an end-of-discharge voltage threshold for the energy storage device and adjusting a time constant of the filter based on at least one voltage-current condition. The filter is configured to filter the end-of-discharge voltage threshold. Further, the comparator is configured to compare the filtered end-of-discharge voltage threshold and a terminal voltage of the energy storage device. In addition, the controller is also configured to determine a change of state of the energy storage device based on the comparison and control the energy storage device based on the change of state.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates one embodiment of an energy storage system according to the present disclosure;

FIG. 2 illustrates a block diagram of one embodiment of a controller of the energy storage system according to the present disclosure;

FIG. 3 illustrates a schematic diagram of one embodiment of a system for determining an end-of-discharge voltage of an energy storage device according to the present disclosure;

FIG. 4 illustrates a schematic diagram of another embodiment of a system for determining an end-of-discharge voltage threshold of an energy storage device according to the present disclosure;

FIG. 5 illustrates a graph of a typical current transient with an end-of-voltage threshold according to the present disclosure;

FIG. 6 illustrates a schematic diagram of still another embodiment of a system for determining an end-of-discharge voltage threshold of an energy storage device according to the present disclosure; and FIG. 7 illustrates a flow diagram of one embodiment of a method for determining an end-of-discharge voltage of an energy storage device according to the present disclosure.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a system and method for controlling an electrochemical cell, e.g. a battery, by more accurately detecting the end-of-discharge of the battery. More specifically, the system is configured to determine an end-of-discharge voltage threshold for the energy storage device and calculate a total discharge that has occurred under the end-of-discharge threshold. During the process, the end-of-discharge voltage threshold can be filtered by a low-pass filter. In addition, the time constant of the low-pass filter can be adjusted based on a current and/or a voltage trend of the battery. Further, the controller is configured to compare the total discharge that has occurred under the end-of-discharge threshold and a predetermined threshold. Based on the comparison, the controller is configured to determine a change of state of the battery and can control the battery based on said change. Thus, the present disclosure operates by allowing dynamic operation under the end-of-discharge threshold through the integration of discharge current under the curve and by filtering of the threshold.

The present disclosure provides many advantages not present in the prior art. For example, due to polarization, the voltages of electrochemical cells tend to show some transient behaviors under the dynamic loads, which results in hitting the predetermined end of discharge voltage thresholds prematurely. Thus, the system and method of the present disclosure more accurately detects the end-of-discharge voltage of electrochemical cells under dynamic loads and prevents under-discharge and consequent damage while drawing as much power and energy as possible so as to maximize the power and energy throughput of the cells per discharge cycle. Accordingly, the present disclosure provides a more reliable and safer system over conventional systems. Referring now to the figures, FIG. 1 illustrates one embodiment of an example energy storage system 100 according to example aspects of the present disclosure. As shown, the energy storage system 100 includes a plurality of energy storage devices 120 or cells, including energy storage device 122, energy storage device 124, energy storage device 126, and energy storage device 128. Four energy storage devices 120 are depicted in the system 100 for purposes of illustration and discussion only. More or fewer energy storage devices 120 can be included in the system 100 without deviating from the scope of the present disclosure.

The energy storage devices 120 can include at least one of a lithium ion battery, a sodium nickel chloride battery, a sodium sulfur battery, a nickel metal hydride battery, a nickel cadmium battery, a fuel cell, or any other suitable battery. Further, the energy storage devices 120 can be used in a variety of applications. For instance, the energy storage devices 120 can be coupled to an inverter to convert DC power provided by the energy storage devices 120 to AC power for supply to a utility grid or other AC application. In addition, the energy storage devices 120 may be used in telecommunications, grid, mobile, and/or any other suitable application.

The system 100 can include a charger 110 configured to provide a charging output to periodically charge the energy storage devices 120. As shown, the charger 110 can be coupled to the energy storage devices 120 via a plurality of contactors 130 coupled in series with the energy storage devices 120. For example, the charger 110 can be coupled to energy storage device 122 via contactor 132. Similarly, the charger 110 can be coupled to energy storage device 124 via contactor 134, to energy storage device 126 via contactor 136, and to energy storage device 128 via contactor 138.

The system 100 can also include a controller 150 configured to control various aspects of the system 100, including controlling the charging of the energy storage devices 120 with the charger 110. Further, the controller 150 can include one or more control devices, such as sensors, controllers, processors, etc. that can monitor various aspects of the system 100 and control charging of the energy storage devices 120.

The controller 150 can monitor the individual current of each of the energy storage devices 120 using one or more current sensors. For instance, the controller 150 can monitor the current of energy storage device 122 using sensor 142. The controller 150 can monitor the current of energy storage device 124 using sensor 144. The controller 150 can monitor the current of energy storage device 126 using sensor 146. The controller 150 can monitor the current of energy storage device 128 using sensor 148. Additionally, the controller 150 can monitor the charging voltage of the charger 110 using a sensor 112.

Referring to FIG. 2, an example controller 150 can include any number of control devices. As shown, for example, the controller 150 can include one or more processor(s) 152 and associated memory device(s) 154 configured to perform a variety of computer-implemented functions and/or instructions (e.g., performing the methods, steps, calculations and the like and storing relevant data as disclosed herein). The instructions when executed by the one or more processors 152 can cause the one or more processors 152 to perform operations, including providing control commands to the charger 110, the contactors 130, the energy storage devices 120 and/or other aspects of the system 100.

Additionally, the controller 150 can also include a communications module 156 to facilitate communications between the controller 150 and the various components of the system 100. Further, the communications module 156 may include a sensor interface 158 (e.g., one or more analog-to-digital converters) to permit signals transmitted from one or more sensors to be converted into signals that can be understood and processed by the one or more processors 152. It should be appreciated that the sensors (e.g. sensors 112, 142, 144, 146, 148) may be communicatively coupled to the communications module 156 using any suitable means. For example, as shown in FIG. 2, the sensors 112, 142, 144, 146, and 148 are coupled to the sensor interface 158 via a wired connection. However, in other embodiments, the sensors may be coupled to the sensor interface 158 via a wireless connection, such as by using any suitable wireless communications protocol known in the art. As such, the processor 152 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The one or more processors 152 can also be configured to compute advanced control algorithms.

Additionally, the memory device(s) 175 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 154 may generally be configured to store suitable computer-readable instructions that, when implemented by the processor(s) 152, configure the controller 150 to perform the various functions as described herein.

Referring now to FIG. 3, a schematic diagram of one embodiment of a system 200 for controlling an energy storage device 120 is illustrated. As shown, the system 200 includes the controller 150 which optionally includes at least one filter 202 having a time constant adjuster 210, at least one integrator 204, and one or more comparators 206, 208. Thus, the system 200 operates by tracking a state change when voltages of one or more of the energy storage devices 120 are above or below a predetermined end-of-discharge voltage threshold. Accordingly, the end-of-discharge of each of the energy storage devices 120 can be determined by decreasing the state change from the predefined state threshold to zero.

More specifically, the system 200 is configured to determine an end-of-discharge (EOD) voltage threshold for one of the energy storage devices 120, e.g. energy storage device 122. For example, in certain embodiments, the end-of-discharge voltage threshold may be determined by discharging the energy storage device 122 from full capacity to the cutoff voltage under various constant currents and temperatures. More specifically, as shown at 215, the end-of-discharge voltage threshold may be determined by inputting the current and/or temperature of the energy storage device 122 into a two-dimensional look-up table to determine the end-of-discharge voltage threshold. The end-of-discharge voltage threshold may then be filtered via filter 202.

As mentioned, the filter 202 may include time constant adjuster 210 that is configured to determine and/or adjust a time constant of the filter 202 based on one or more voltage-current conditions. For example, in certain embodiments, the voltage-current conditions may include a current and a voltage trend. Thus, the time constant of the filter 202 can be adjusted based on the voltage trend and the current. More specifically, as shown in the illustrated embodiment, the time constant adjuster 210 may include one or more one-dimensional look-up tables 212, 214 configured for determining a current time constant based on the current and a voltage time constant based on the voltage trend. At 216, the time constant adjuster 210 is configured to determine a maximum time constant between the current time constant and the voltage time constant. Thus, as shown, the system 200 adjusts the time constant of the filter 202 based on the maximum time constant 216. For example, a large time constant may be adopted when the voltage of the energy storage device 122 is increasing while the current is in the discharge current direction. As such, the voltage of the energy storage device 122 can be recovered to a stable voltage before reaching the end-of-discharge voltage. The time constant may also be adjusted based on the current so as to ensure that the filtered end-of-discharge voltage degrades faster than the voltage of the energy storage device 122 when the load is switched from a light load to a heavy load during discharge.

It should be understood that the filter 202 may include any suitable filter known in the art. For example, in particular embodiments, the filter 202 may be a low-pass filter. As used herein, a low-pass filter is generally understood to encompass a filter that passes signals with a frequency lower than a certain cutoff frequency and attenuates signals with frequencies higher than the cutoff frequency.

Still referring to FIG. 3, the filtered end-of-discharge threshold may be compared with a terminal voltage of the energy storage device 122 via comparator 206. More specifically, in certain embodiments, the comparator 206 may be configured to compare the filtered end-of-discharge voltage threshold and the terminal voltage of the energy storage device 122 and determine whether the terminal voltage is above or below the end-of-discharge voltage threshold. In particular embodiments, if the terminal voltage is above the end-of-discharge voltage threshold, then the controller 150 is configured to conclude that the energy storage device 122 is not operating within a trip zone. Alternatively, if the terminal voltage is below the end-of-discharge voltage threshold, then the controller 150 is configured to conclude that the energy storage device 122 is operating within the trip zone.

The system 200 is also configured to determine a change of state of the energy storage device 122, e.g. via integrator 204. Further, in certain embodiments, the state change is tracked based on the voltages of the energy storage device 122 to determine whether the voltages are above or below the predefined end-of-discharge voltage thresholds. More specifically, the state change increases toward to a predefined discharge threshold when the voltages of energy storage device 122 are above the end-of-discharge voltage thresholds, whereas the state change decreases toward to zero when the voltages of energy storage device 122 are below the end-of-discharge voltage thresholds. Further, the speed of integration for both directions may be controlled by the current weight so as to adjust the sensitivity of the end of discharge algorithm. Accordingly, a robust end-of-discharge voltage of the energy storage device 122 can be determined by tracking the weighted state change as well as the voltage trend and current-based variable time constant low-pass filter 202.

For example, as shown in FIG. 3, the output of the comparator 206 can be used as an input to the integrator 204 (which essentially operates on current) to ensure that the energy storage device 122 only operates in the trip zone for a certain cumulative charge swing. In addition, as shown at 218, the direction of the integrator 204 is controlled by the output of the comparator 206. More specifically, if the battery terminal voltage is above the end-of-discharge voltage threshold (i.e. the battery terminal voltage is not in the trip zone), then the integrator direction is negative one (e.g. −1), which means that the absolute current integrator 220 will integrate the current down to zero ampere-hours to provide an output (e.g. Qtripzone). Thus, when the integrator 220 output reaches zero, the output of the comparator 208 (e.g. Qtrip) will become true. In contrast, if the battery terminal voltage is below the end-of-discharge voltage threshold (i.e. the battery terminal voltage is in the trip zone), then the integrator direction is positive one (e.g. +1), which means that the absolute current integrator 220 will integrate the current from zero ampere-hours to an upper bound of ampere-hours to provide an output (e.g. Qtripzone). Thus, the output of comparator 208 (e.g. Qtrip) will be false and there will be no "Qtrip" for end-of-discharge. In addition, in certain embodiments as shown at 224, the speed of the state change for both directions may be controlled by the current weight so as to adjust the sensitivity of the end-of-discharge algorithm.

Thus, the controller 150 is configured to send a control command (e.g. trip command) to the energy storage device 120 so as to control the device 120 based on the change of state. For example, in certain embodiments, the trip command may include a control signal that trips the energy storage device 120 when the integrated current reaches zero. More specifically, at 222, the controller 150 is configured to ensure that the energy storage device 120 is not disconnected when the device 120 is recharging and when the device 120 is not in the trip zone (as determined by an output from the comparator 206). Thus, in one embodiment, the controller 150 is configured to disconnect the energy storage device 120 only when all three conditions are satisfied (i.e. QTrip is true, the device 120 is not recharging, and the device 120 is not in trip zone). Thus, the system and method of the present disclosure more accurately detects the end-of-discharge voltage of an energy storage device so as to ensure that the device is not disconnected from operation prematurely.

Referring now to FIG. 4, a schematic diagram of another embodiment of the system 200 for controlling one or more energy storage devices 120 is illustrated. As shown, the system 200 includes the controller 150 which optionally includes a multiplier 217 and at least one comparator 209. More specifically, the system 200 is configured to determine an end-of-discharge (EOD) voltage threshold for one of the energy storage devices 120, e.g. energy storage device 122. For example, in certain embodiments, the end-of-discharge voltage threshold may be determined by discharging the energy storage device 122 from full capacity to the cutoff voltage under various constant currents and temperatures. More specifically, as shown, the end-of-discharge voltage threshold may be determined by inputting the current and/or temperature of the energy storage device 122 into a two-dimensional look-up table 213 to determine the end-of-discharge voltage threshold. In contrast to the system of FIG. 3, however, the end-of-discharge voltage threshold is not filtered. In addition, the value of the current (e.g. Battery Current) may be multiplied by a voltage weight that is proportional to a distance to the end-of-discharge voltage threshold (e.g. "depth" weight) at multiplier 217 before the integration process at integrator 205. The integrator 205 can then determine the end-of-discharge state by integrating the weighted current. The comparator 209 then compares the integrated value of the weighted current under the end-of-discharge curve against an end-of-discharge threshold of the energy storage device 122. Thus, the system 200 is configured to control the energy storage device 122 based on the comparison.

By eliminating the filter in certain embodiments, the system 200 can be simplified. In addition, in some embodiments, performance of the system 200 can be improved as filtering of the end-of-discharge voltage threshold can sometimes introduce additional lag to the process that can result in missed potential disconnection events.

In certain embodiments, the weight associated with the "depth" under the curve is based on the physics of the process. Thus, the potential damage to cells due to operation under the curve is dependent on the volts under the curve. Therefore, in particular embodiments, the disconnection function is dependent upon how substantial the energy storage device 120 is operating under the curve. More specifically, as shown in the illustrated embodiment of FIG. 4, a bilinear curve for the relationship between the depth and the weight is applied to the integrator 205. In additional embodiments, still other forms (e.g., purely linear, nonlinear with low gain in the middle and high gain towards the ends, etc.) are also possible and can be chosen based on varying circumstances.

The bilinear depth function can be selected to ensure that during the worst case transient events, operation under the end-of-discharge voltage threshold does not result in disconnection, while the charge state of the energy storage device 120 does not warrant disconnection. For example, as shown in FIG. 5, such an event begins with a certain current value and a corresponding cell voltage as illustrated by line 250. Due to an activity associated with the external load, the current is then switched down as shown by line 252. As shown in the upper graph, the voltage has a two-stage response to the change in current. First, the value of voltage shifts, e.g. as shown from $V_1$ to $V_2$, and then gradually recovers to a final value as shown at $V_3$ and consequently, above the end-of-discharge voltage threshold as illustrated by line 254. Thus, the system 200 avoids disconnecting the energy storage device 120 when operating under the voltage threshold unless there is sustained operation under the voltage threshold.

In certain embodiments, the end-of-discharge voltage threshold can be selected to ensure that no disconnection occurs during worst-case operation of the energy storage device 120, but also selected to ensure that an unnecessary delay is not added under justified disconnection conditions.

Referring now to FIG. 6, a block diagram of still another embodiment of the system 200 is illustrated. As shown at 203, a filtered derivative of the current signal can be utilized to temporarily move the end-of-discharge voltage threshold in order to capture transient effects. The primary function of the filtered derivative path is to tilt the voltage threshold up or down during significant changes in current. Thus, the embodiment of FIG. 6 captures benefits from both embodiments of FIGS. 3 and 4 without unnecessary complexity. In addition, the embodiment of FIG. 6 can allow for a lower threshold as well as faster disconnection under some conditions.

In addition, the depth weight and the voltage threshold can be selected in a similar manner to the methods described herein. The gain (e.g. K) should be selected to ensure that all integration is avoided during the worst-case transient event. Further, in certain embodiments, the system 200 can ensure that the lag added to the signal due to the filtering of the derivative is not excessive to the extent that disconnection is delayed more than required. The filtered derivative can be obtained using a wide array of digital filtering methods. For example, in certain embodiments, an infinite impulse response (IIR) filter may be used. In further embodiments, a higher order or a finite impulse response (FIR) filter can also be used.

The system described herein typically has improved responsiveness. For example, in certain embodiments, where the output of the end-of-discharge voltage threshold is not filtered, the disconnection delay can be adjusted in a straightforward manner and the requirements of robustness and sensitivity can be easily balanced. Another advantage of the system includes the ability to respond to operation substantially below or above the end-of-discharge voltage threshold.

Referring now to FIG. 7, a flow diagram of a method 300 for controlling an electrochemical cell, e.g. a battery, by more accurately detecting the end-of-discharge of the battery is illustrated. As shown at 302, the method 300 includes determining an end-of-discharge voltage threshold for the energy storage device. Another step 304 of the method 300 includes filtering the end-of-discharge voltage via a filter. At 306, the method 300 includes adjusting a time constant of the filter based on at least one voltage-current condition. At 308, the method 300 also includes comparing the filtered end-of-discharge voltage threshold and a terminal voltage of the energy storage device. At 310, the method 300 also includes determining a change of state of the energy storage device based on the comparison. At 312, the method 300 also includes controlling the energy storage device based on the change of state.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for controlling an energy storage device, the method comprising:
   determining an end-of-discharge voltage threshold for the energy storage device;
   subsequently filtering the end-of-discharge voltage threshold via a filter;
   adjusting a time constant of the filter based on at least one voltage-current condition;
   comparing the filtered end-of-discharge voltage threshold and a terminal voltage of the energy storage device;
   based on the comparison, determining a change of state of the energy storage device; and,
   controlling the energy storage device based on the change of state.

2. The method of claim 1, wherein the at least one voltage-current condition comprises at least a current and a voltage trend.

3. The method of claim 2, wherein adjusting the time constant of the filter based on the voltage-current condition further comprises determining a current time constant based on the current from a one-dimensional look-up table and determining a voltage time constant based on the voltage trend from another one-dimensional look-up table.

4. The method of claim 3, further comprising determining a maximum time constant between the current time constant and the voltage time constant.

5. The method of claim 4, further comprising adjusting the time constant of the filter based on the maximum time constant.

6. The method of claim 5, wherein the filter comprises a low-pass filter.

7. The method of claim 1, wherein determining the end-of-discharge voltage threshold for the energy storage device further comprises inputting the current and temperature of the energy storage device into a two-dimensional look-up table to determine the end-of-discharge voltage threshold.

8. The method of claim 1, wherein comparing the filtered end-of-discharge voltage threshold and the terminal voltage of the energy storage device further comprises determining whether the terminal voltage is above or below the end-of-discharge voltage threshold, wherein if the terminal voltage is above the end-of-discharge voltage threshold, then the energy storage device is not operating in a trip zone and wherein, if the terminal voltage is below the end-of-discharge voltage threshold, then the energy storage device is operating in a trip zone.

9. The method of claim 8, wherein determining the change of state of the energy storage device further comprises integrating the current from zero to an upper bound of ampere-hours if the terminal voltage is within the trip zone and integrating the current down from an instantaneous value to zero ampere-hours if the terminal voltage is not within the trip zone.

10. The method of claim 9, wherein controlling the energy storage device based on the change of state further comprises tripping the energy storage device when the integrated current reaches zero.

11. The method of claim 1, further comprising controlling a speed of the integration by a current weight.

12. The method of claim 1, wherein the energy storage device comprises at least one of a lithium ion battery, a sodium nickel chloride battery, a sodium sulfur battery, a nickel metal hydride battery, a nickel cadmium battery, or a fuel cell.

13. A method for controlling an energy storage device, the method comprising:
  determining an end-of-discharge voltage threshold for the energy storage device based on, at least in part, a temperature and a current of the energy storage device;
  multiplying the current by a voltage weight, the voltage weight being a function of a distance to the end-of-discharge voltage threshold;
  determining an end-of-discharge voltage by integrating a weighted current;
  comparing the integrated weighted current with a predetermined threshold; and,
  controlling the energy storage device based on the comparison.

14. A system for controlling an energy storage device, the energy storage device comprising:
  a controller comprising, at least, a filter, an integrator, and a comparator, the controller configured to perform one or more operations, the one or more operations comprising:
    determining an end-of-discharge voltage threshold for the energy storage device;
    subsequently filtering, via the filter, the end-of-discharge voltage threshold;
    adjusting a time constant of the filter based on at least one voltage-current condition;
    comparing, via the comparator, the filtered end-of-discharge voltage threshold and a terminal voltage of the energy storage device;
    determining a change of state of the energy storage device based on the comparison; and
    controlling the energy storage device based on the change of state.

15. The system of claim 14, wherein the at least one voltage-current condition comprises at least a current and a voltage trend, and wherein adjusting the time constant of the filter based on the voltage-current condition further comprises determining a current time constant based on the current from a one-dimensional look-up table and determining a voltage time constant based on the voltage trend from another one-dimensional look-up table.

16. The system of claim 15, further comprising determining a maximum time constant between the current time constant and the voltage time constant and adjusting the time constant of the filter based on the maximum time constant, wherein the filter comprises a low-pass filter.

17. The system of claim 14, wherein determining the end-of-discharge voltage threshold for the energy storage device further comprises inputting the current and temperature of the energy storage device into a two-dimensional look-up table to determine the end-of-discharge voltage threshold.

18. The system of claim 14, wherein comparing the filtered end-of-discharge voltage threshold and the terminal voltage of the energy storage device further comprises determining whether the terminal voltage is above or below the end-of-discharge voltage threshold, wherein if the terminal voltage is above the end-of-discharge voltage threshold, then the energy storage device is not operating in a trip zone and wherein, if the terminal voltage is below the end-of-discharge voltage threshold, then the energy storage device is operating in a trip zone.

19. The system of claim 18, wherein determining the change of state of the energy storage device further comprises integrating the current from zero to an upper bound of ampere-hours if the terminal voltage is within the trip zone and integrating the current down from an instantaneous value to zero ampere-hours if the terminal voltage is not within the trip zone.

20. The system of claim 14, wherein controlling the energy storage device based on the change of state further comprises tripping the energy storage device when the integrated current reaches zero.

* * * * *